US012588172B2

(12) United States Patent
Kumano et al.

(10) Patent No.: US 12,588,172 B2
(45) Date of Patent: Mar. 24, 2026

(54) DISPLAY DEVICE AND HEAD-UP DISPLAY

(71) Applicant: PANASONIC INTELLECTUAL PROPERTY MANAGEMENT CO., LTD., Osaka (JP)

(72) Inventors: Yutaka Kumano, Hyogo (JP); Kouzou Yuuki, Osaka (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 470 days.

(21) Appl. No.: 18/096,750

(22) Filed: Jan. 13, 2023

(65) Prior Publication Data

US 2023/0292476 A1      Sep. 14, 2023

(30) Foreign Application Priority Data

Mar. 14, 2022      (JP) ................................. 2022-039254

(51) Int. Cl.
*H05K 7/20*      (2006.01)
*B60K 35/23*      (2024.01)
*B60K 35/60*      (2024.01)
*G02B 27/01*      (2006.01)

(52) U.S. Cl.
CPC ......... *H05K 7/20963* (2013.01); *B60K 35/23* (2024.01); *B60K 35/60* (2024.01); *G02B 27/0101* (2013.01); *G02B 2027/0192* (2013.01)

(58) Field of Classification Search
CPC .. H05K 7/20963; H05K 7/20; G02B 27/0101; G02B 2027/0192; G02B 27/01; G02B 27/0149; B60K 35/00; B60K 35/23; B60K 35/60; B60K 2360/25; B60K 35/231; B60Y 2410/114; G02F 1/13; G02F 1/1333
See application file for complete search history.

(56) References Cited

U.S. PATENT DOCUMENTS

| | | | |
|---|---|---|---|
| 10,551,886 B1 * | 2/2020 | de la Fuente ...... H05K 7/20963 |
| 2022/0328576 A1 * | 10/2022 | Huang .................. G02F 1/1333 |
| 2023/0221553 A1 * | 7/2023 | Toyoshima ....... G02F 1/133385 |
| | | | 349/11 |

FOREIGN PATENT DOCUMENTS

| | | |
|---|---|---|
| JP | 2001-23530 | 1/2001 |
| JP | 2002-244214 | 8/2002 |
| JP | 2013-238726 | 11/2013 |
| JP | 2017-83699 A | 5/2017 |

OTHER PUBLICATIONS

Office Action issued in Corresponding JP Patent Application No. 2022-039254, dated Jun. 3, 2025, along with an English translation thereof.

(Continued)

*Primary Examiner* — Balram T Parbadia
(74) *Attorney, Agent, or Firm* — Greenblum & Bernstein, P.L.C.

(57)      ABSTRACT
A display device includes: a display panel that includes, in a front surface, a display area in which an image is displayed, and projects, from the display area, light that has entered from a back surface as display light showing the image; a thermal conductive sheet that is disposed contacting the display panel, and has an opening positionally corresponding with the display area; and a light transmissive material that sandwiches the thermal conductive sheet together with the display panel.

12 Claims, 6 Drawing Sheets

(56)      References Cited

OTHER PUBLICATIONS

Office Action issued in Corresponding JP Patent Application No. 2022-039254, dated Sep. 2, 2025, along with an English translation thereof.

Office Action issued in Corresponding DE Patent Application No. 102023101776.4, dated Nov. 17, 2025, along with an English translation thereof.

* cited by examiner

DISPLAY DEVICE AND HEAD-UP DISPLAY

CROSS REFERENCE TO RELATED APPLICATION

The present application is based on and claims priority of Japanese Patent Application No. 2022-039254 filed on Mar. 14, 2022.

FIELD

The present disclosure relates to a display device and a head-up display.

BACKGROUND

A head-up display (HUD) is an in-vehicle device that superimposes a virtual image onto a view ahead of a vehicle and displays the virtual image on the windshield (front glass) of the vehicle. The virtual image is a virtual image of an image displayed in a display area of a display panel by light from a backlight passing through the display area of the display panel.

In the above-described head-up display, the display panel may be damaged by the display panel becoming very hot due to sunlight (outside light) that enters inside a passenger cabin through the windshield from outside the vehicle focusing onto the display area of the display panel. In order to circumvent such a problem, a technique of conducting the heat of a display panel generated due to sunlight to a transparent member made of glass for dissipation of the heat by bringing the transparent member into contact with the display panel has been proposed (for example, see Patent Literature (PTL) 1).

CITATION LIST

Patent Literature

PTL 1: Japanese Unexamined Patent Application Publication No. 2017-83699

SUMMARY

However, the technique disclosed by the above PTL 1 can be improved upon.

In view of the above, the present disclosure provides a display device and a head-up display which are capable of improving upon the above related art.

A display device according to one aspect of the present disclosure is a display device used for a head-up display. The display device includes: a display panel that includes, in a front surface, a display area in which an image is displayed, and projects, from the display area, light that has entered from a back surface as display light showing the image; a thermal conductive sheet that is disposed contacting the display panel, and has an opening positionally corresponding with the display area; and a light transmissive material that sandwiches the thermal conductive sheet together with the display panel.

Note that these general or specific aspects may be realized by a system, a method, an integrated circuit, a computer program, or a non-transitory computer-readable recording medium such as a compact disc read-only memory (CD-ROM), or by any optional combination of systems, methods, integrated circuits, computer programs, and recording media.

A display device etc. according to one aspect of the present disclosure are capable of improving upon the above related art.

BRIEF DESCRIPTION OF DRAWINGS

These and other advantages and features of the present disclosure will become apparent from the following description thereof taken in conjunction with the accompanying drawings that illustrate a specific embodiment of the present disclosure.

DESCRIPTION OF EMBODIMENTS

Figure 1:
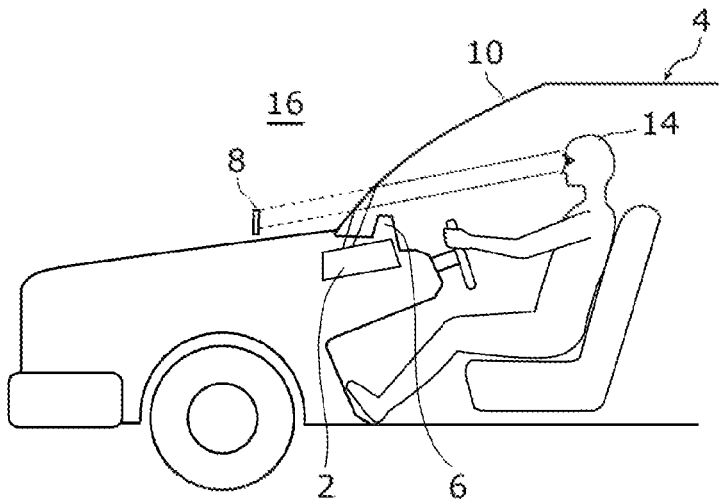
FIG. 1 is a diagram illustrating a vehicle in which a head-up display is provided according to an embodiment.

[Underlying Knowledge Forming Basis of the Present Disclosure]

The inventors of the present disclosure have found out that the technique disclosed in the Background causes the following problem.

The technique disclosed in the above-described PTL 1 presents a problem that the heat of a display panel cannot be sufficiently dissipated.

In order to provide a display device capable of sufficiently dissipating heat, a display device according to one aspect of the present disclosure is a display device used for a head-up display which includes: a display panel that includes, in a front surface, a display area in which an image is displayed, and projects, from the display area, light that has entered from a back surface as display light showing the image; a thermal conductive sheet that is disposed contacting the display panel, and has an opening positionally corresponding with the display area; and a light transmissive material that sandwiches the thermal conductive sheet together with the display panel.

According to the aspect, heat is generated in a display panel when sunlight (outside light) is focused onto the display panel. The heat generated in the display panel is conducted to a light transmissive material via a thermal conductive sheet to be dissipated from the light transmissive material into the air. With this, the heat generated in the display panel can be efficiently conducted to the light transmissive material via the thermal conductive sheet, compared to the case where the light transmissive material is in direct contact with the display panel. As a result, the heat of the display panel can be sufficiently dissipated, and thus damage to the display panel due to the display panel becoming very hot can be prevented.

For example, the thermal conductive sheet and the light transmissive material may adhere to each other with an adhesive.

According to the aspect, the thermal conductive sheet can be readily fastened to the light transmissive material.

For example, the thermal conductive sheet may be disposed contacting the front surface of the display panel, and the display light may be projected from the display area of the display panel through the opening in the thermal conductive sheet.

According to the aspect, heat generated in the display panel can be efficiently conducted from the front surface side of the display panel to the light transmissive material via the thermal conductive sheet.

For example, the thermal conductive sheet may be disposed contacting the back surface of the display panel, and the light that has entered from the back surface of the display panel through the opening in the thermal conductive sheet may be projected from the display area as the display light.

According to the aspect, heat generated in the display panel can be efficiently conducted from the back surface side of the display panel to the light transmissive material via the thermal conductive sheet.

For example, in a view perpendicular to the display area of the display panel, a periphery of the thermal conductive sheet may be located outward of a periphery of the display panel.

According to the aspect, the thermal conductive sheet having a large area size can be obtained, and thus heat generated in the display panel can be even more efficiently conducted to the light transmissive material via the thermal conductive sheet.

For example, in a view perpendicular to the display area of the display panel, the opening and the display area may have a similar shape.

According to the aspect, light passing through the display area can be prevented from being blocked out by the thermal conductive sheet.

For example, a thickness of the light transmissive material may be greater than a thickness of the thermal conductive sheet.

According to the aspect, a heat dissipation effect of a portion without the thermal conductive sheet in the light transmissive material can be enhanced.

For example, the display device may further include a housing for accommodating the display panel. In a view perpendicular to the display area of the display panel, a periphery of the thermal conductive sheet may be located outward of a periphery of the light transmissive material, and may contact the housing.

According to the aspect, heat generated in the display panel can be conducted to the light transmissive material via the thermal conductive sheet, and as well to the housing via the thermal conductive sheet. With this, heat generated in the display panel can be dissipated not only from the light transmissive material, but also from the housing. Accordingly, the heat of the display panel can be even more effectively dissipated.

For example, the thermal conductive sheet may be one of a graphite sheet and metal foil.

According to the aspect, the thermal conductive sheet which is a graphite sheet or metal foil allows heat generated in the display panel to be even more efficiently conducted to the light transmissive material via the thermal conductive sheet.

A head-up display according to one aspect of the present disclosure includes any one of the above-described display devices, and a mirror that reflects display light projected from the display device toward a display medium.

According to the aspect, heat of the display panel of the display device can be sufficiently dissipated in the same manner as described above.

Hereinafter, embodiments will be described in detail with reference to the drawings.

Note that the embodiments described below each show a general or specific example of the present disclosure. The numerical values, shapes, materials, structural elements, the arrangement and connection of the structural elements, steps, and the orders of the steps, and the like presented in the embodiments below are mere examples, and are not intended to limit the present disclosure. In addition, among the structural elements in the embodiments below, those not recited in any one of the independent claims defining the broadest concept of the present disclosure are described as optional structural elements.

EMBODIMENT

[1. Configuration of Head-Up Display]

Figure 2:
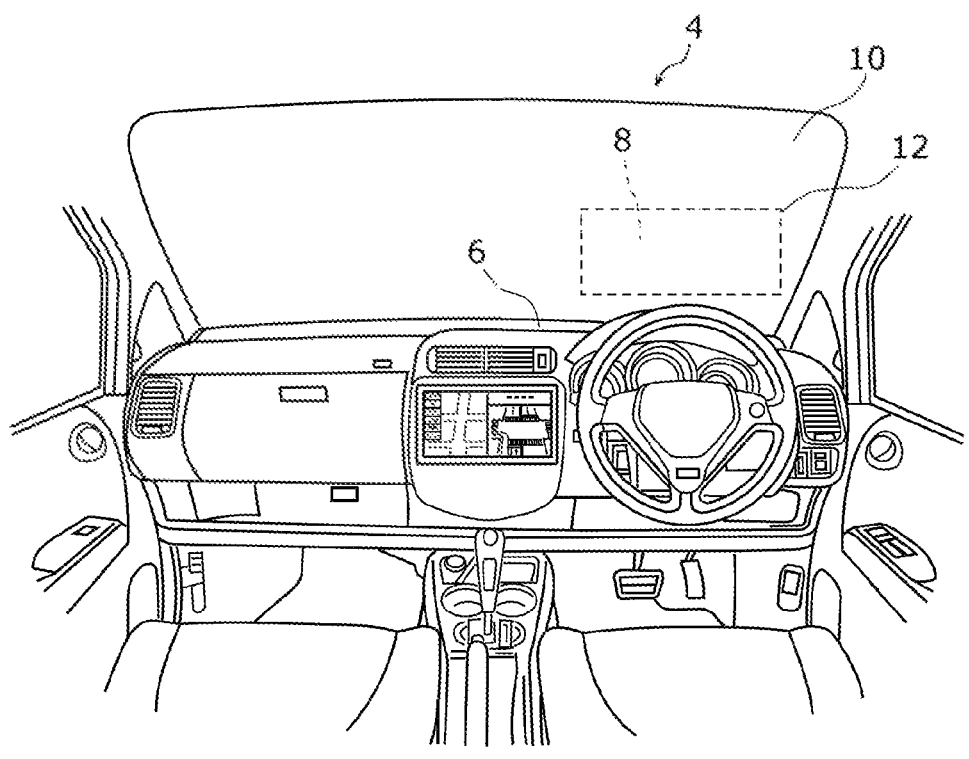
FIG. 2 is a diagram illustrating an area of a windshield in which an HUD image is displayed by the head-up display according to the embodiment.
Figure 3:
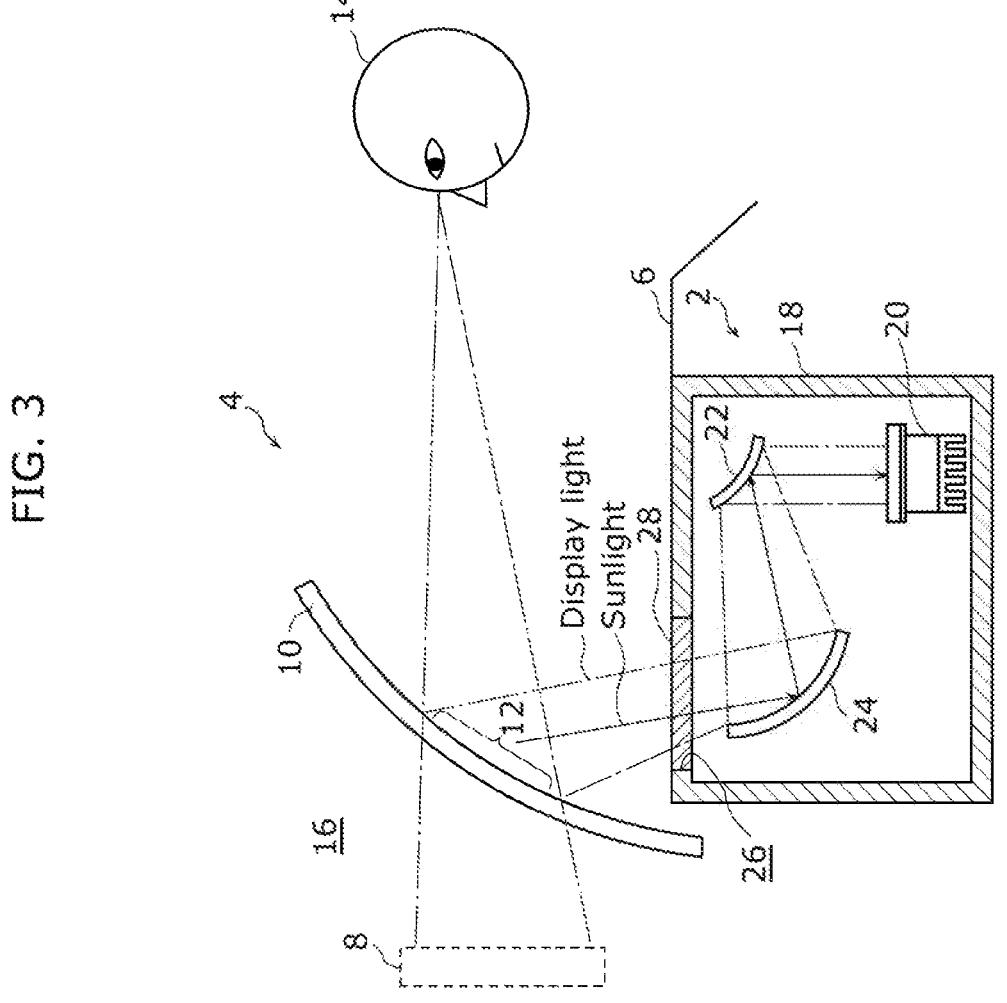
FIG. 3 is a diagram illustrating a configuration of the head-up display according to the embodiment.

A configuration of head-up display 2 according to an embodiment will be described with reference to FIG. 1 through FIG. 3. FIG. 1 is a diagram illustrating vehicle 4 in which head-up display 2 is provided according to the embodiment. FIG. 2 is a diagram illustrating area 12 of windshield 10 in which HUD image 8 is displayed by head-up display 2 according to the embodiment. FIG. 3 is a diagram illustrating a configuration of head-up display 2 according to the embodiment.

As illustrated in FIG. 1, head-up display 2 according to the embodiment is provided inside dashboard 6 of vehicle 4 such as an automobile. As illustrated in FIG. 1 through FIG. 3, head-up display 2 projects display light for displaying HUD image 8, which is a virtual image, toward, for example, area 12 that is located closer to the driver's seat and on the lower side of windshield 10 (one example of a display medium) of vehicle 4 to cause the display light to be reflected off area 12 of windshield 10 and to travel toward driver 14. With this, driver 14 can see HUD image 8, which is a virtual image and is superimposed on a view ahead of windshield 10, in area 12 of windshield 10. In other words, driver 14 sees HUD image 8 as if HUD image 8 is displayed in space 16 ahead of windshield 10.

As illustrated in FIG. 3, head-up display 2 includes main housing 18 (one example of a housing), display device 20, first mirror 22 (one example of a mirror) and second mirror 24 (one example of a mirror).

Main housing 18 is formed in a box shape, and includes metal such as aluminum. Main housing 18 is provided inside dashboard 6 of vehicle 4. Main housing 18 accommodates, inside main housing 18, display device 20, first mirror 22, and second mirror 24. The top surface of main housing 18 is disposed so as to be opposite windshield 10. Main housing 18 has opening 26 in the top surface. This opening 26 is covered by cover member 28, which is, for example, a transparent resin plate.

Display device 20 is a picture generation unit (PGU) for projecting, toward first mirror 22, display light for displaying HUD image 8. A configuration of display device 20 will be described later.

First mirror 22 is, for example, a convex mirror, and reflects display light from display device 20 toward second mirror 24. Second mirror 24 is, for example, a concave mirror, and reflects the display light from first mirror 22 toward area 12 of windshield 10. The display light from second mirror 24 passes through cover member 28, and enters the eyes of driver 14 after being reflected off area 12 of windshield 10.

Note that although head-up display 2 according to the embodiment includes two mirrors (first mirror 22 and second mirror 24), the configuration of head-up display 2 is not limited to the foregoing configuration. Head-up display 2 may include one mirror.

[2. Configuration of Display Device]

Figure 4:
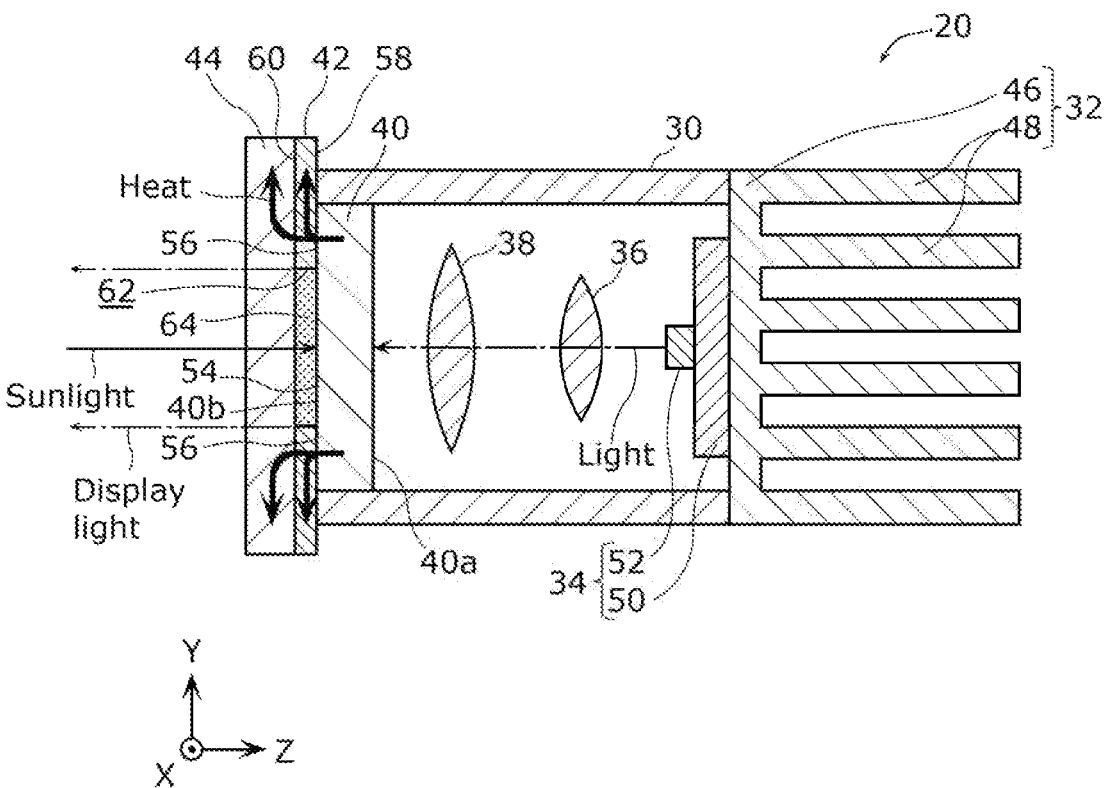
FIG. 4 is a cross sectional view of a display device according to the embodiment.
Figure 5:
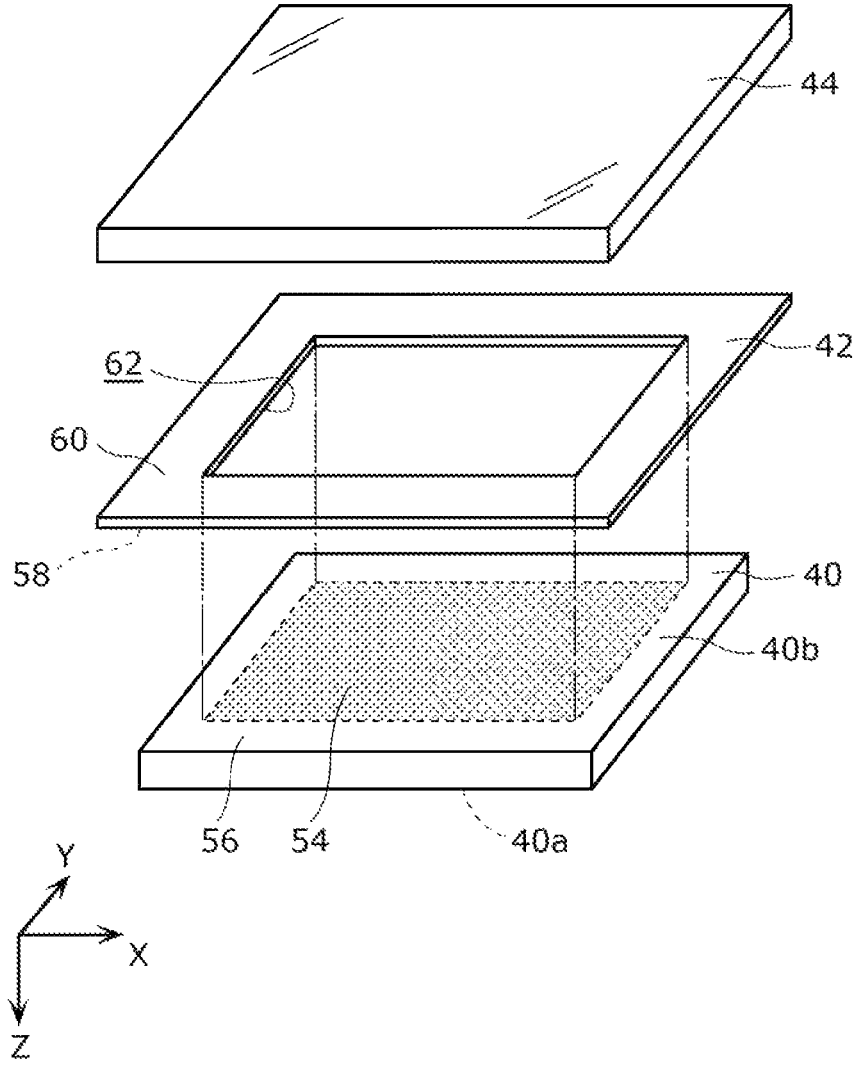
FIG. 5 is an exploded perspective view of the display device according to the embodiment, which illustrates a display panel, a thermal conductive sheet, and a light transmissive material of the display device.

Next, a configuration of display device 20 according to the embodiment will be described with reference to FIG. 4 and FIG. 5. FIG. 4 is a cross sectional view of display device 20 according to the embodiment. FIG. 5 is an exploded perspective view of display device 20 according to the embodiment, which illustrates display panel 40, thermal conductive sheet 42, and light transmissive material 44.

Note that, in FIG. 4 and FIG. 5, the transverse direction of display panel 40 is denoted as the X axis direction, the longitudinal direction of display panel 40 is denoted as the Y axis direction, and the thickness direction of display panel 40 is denoted as the Z axis direction.

As illustrated in FIG. 4, display device 20 includes PGU housing 30 (one example of a housing), heat sink 32, backlight 34, condenser lens 36, field lens 38, display panel 40, thermal conductive sheet 42, and light transmissive material 44.

PGU housing 30 is provided for supporting heat sink 32, display panel 40, etc., and is fixed inside main housing 18 (see FIG. 3). PGU housing 30 is formed in, for example, a tubular shape whose cross section is in a quadrilateral shape. PGU housing 30 mainly includes resin.

Heat sink 32 is provided for dissipation of heat from backlight 34. Heat sink 32 includes base portion 46 and a plurality of fins 48. Base portion 46 is supported by one end portion of PGU housing 30. The plurality of fins 48 protrude from a first principal surface of base portion 46 toward the side opposite the PGU housing 30 side. Heat sink 32 includes, for example, metal such as aluminum.

Backlight 34 is a light source that emits light toward back surface 40a of display panel 40, and is disposed inside PGU housing 30. Backlight 34 includes base 50, and light emitting diode (LED) 52 mounted on base 50. Base 50 is supported by a second principal surface (the surface on the opposite side of the first principal surface) of base portion 46 of heat sink 32. Note that although FIG. 4 illustrates only one LED 52, a plurality of LEDs 52 may be mounted on base 50.

Condenser lens 36 is disposed between backlight 34 and field lens 38 inside PGU housing 30. Light from backlight 34 enters condenser lens 36. Condenser lens 36 concentrates the entered light, and emits the light toward field lens 38.

Field lens 38 is disposed between condenser lens 36 and display panel 40 inside PGU housing 30. Light from condenser lens 36 enters field lens 38. Field lens 38 further concentrates the entered light, and emits the light toward back surface 40a of display panel 40.

Display panel 40 is, for example, a liquid crystal panel, and the outside shape of display panel 40 is in the shape of a quadrilateral in the XY plan view (i.e., in a view perpendicular to display area 54 of display panel 40). Display panel 40 is disposed on the other side of PGU housing 30 within PGU housing 30. Display panel 40 has back surface 40a that is opposite field lens 38.

Display panel 40 includes, on front surface 40b (the surface on the opposite side of back surface 40a), display area 54 in which an image is displayed. In FIG. 5, the illustration of display area 54 is patterned with dots so that display area 54 is readily distinguishable. As illustrated in FIG. 5, the outside shape of display area 54 is in the shape of a quadrilateral in the XY plan view, and the size of display area 54 is smaller than the size of the entirety of front surface 40b of display panel 40. Front surface 40b of display panel 40 includes frame area 56 outside display area 54 which does not contribute to displaying of an image (i.e., light entered from back surface 40a of display panel 40 is not allowed to pass through).

Light entered from back surface 40a of display panel 40 passes through display panel 40 and exits from display area 54. In other words, display panel 40 projects light that has passed through display area 54 as display light showing an image displayed in display area 54.

Thermal conductive sheet 42 is a thermally conductive member having relatively high thermal conductivity, and is, for example, a graphite sheet. A graphite sheet has a stacked structure in the thickness direction (Z axis direction), and has a characteristic that the thermal conductivity in the surface direction (in-plane XY direction) is higher than the thermal conductivity in the thickness direction. The outside shape of thermal conductive sheet 42 is in the shape of, for example, a quadrilateral in the XY plan view, and a thickness of thermal conductive sheet 42 in the Z axis direction is about 0.05 mm, for example.

Thermal conductive sheet 42 is disposed so as to contact frame area 56 of front surface 40b of display panel 40 such that heat can be conducted. Thermal conductive sheet 42 has two faces on which first adhesive layer 58 and second adhesive layer 60 are respectively formed. Thermal conductive sheet 42 and frame area 56 of front surface 40b of display panel 40 adhere to each other by first adhesive layer 58. In addition, in the XY plan view, the periphery of thermal conductive sheet 42 is located outward of the periphery of display panel 40. Note that first adhesive layer 58 need not necessarily be used.

Thermal conductive sheet 42 has opening 62 in the shape of a quadrilateral in the XY plan view. Opening 62 in thermal conductive sheet 42 is opposite (i.e., positionally corresponds with) display area 54 of display panel 40. Opening 62 and display area 54 of display panel 40 have a similar shape, and have substantially the same size. In other words, thermal conductive sheet 42 is disposed so as to avoid display area 54 of display panel 40. With this, display light from display area 54 of display panel 40 is projected through opening 62 in thermal conductive sheet 42, and thus is not blocked out by thermal conductive sheet 42.

Light transmissive material 44 is, for example, a transparent glass plate, and the outside shape of light transmissive material 44 is in the shape of a quadrilateral in the XY plan view. Light transmissive material 44 sandwiches thermal conductive sheet 42 together with display panel 40. In other words, light transmissive material 44 is disposed opposite display panel 40 with thermal conductive sheet 42 interposed therebetween, and is in contact with thermal conductive sheet 42 such that heat can be conducted. In addition, in the XY plan view, the periphery of light transmissive material 44 is located outward of the periphery of display panel 40, and the size of light transmissive material 44 is substantially the same as the size of thermal conductive sheet 42. In addition, a thickness of light transmissive material 44 in the Z axis direction is, for example, about 1.0 mm, and is greater than the thickness of thermal conductive sheet 42 in the Z axis direction. Note that it is not necessary for light transmissive material 44 to have transparency of 100% transmittance. Light transmissive material 44 may have transparency less than 100% transmittance (e.g., about 80% to 90% transmittance).

Light transmissive material 44 and thermal conductive sheet 42 adhere to each other by second adhesive layer 60 of thermal conductive sheet 42. Note that light transmissive material 44 and thermal conductive sheet 42 may adhere to each other with an adhesive. Moreover, an inside of opening 62 in thermal conductive sheet 42 between light transmissive material 44 and front surface 40b of display panel 40 is filled with transparent, resinous adhesive 64. Note that light transmissive material 44 and front surface 40b of display panel 40 may adhere to each other with this adhesive 64.

Display light from display area 54 of display panel 40 passes through adhesive 64 inside opening 62 in thermal conductive sheet 42, enters |light transmissive material 44, exits from light transmissive material 44, and is projected outside light transmissive material 44.

[3. Advantageous Effects]

Next, advantageous effects produced by display device 20 according to the embodiment will be described with reference to FIG. 3 and FIG. 4.

As illustrated in FIG. 3, sunlight (outside light) enters inside the passenger cabin of vehicle 4 from outside through windshield 10 during the daytime. The sunlight that has entered inside the passenger cabin enters inside main housing 18 through cover member 28 of head-up display 2, reflected by each of second mirror 24 and first mirror 22, and enters display device 20.

As illustrated in FIG. 4, sunlight that has entered light transmissive material 44 of display device 20 passes through light transmissive material 44 and adhesive 64 inside opening 62 in thermal conductive sheet 42, and is focused onto front surface 40b of display panel 40. With this, heat resulting from sunlight is generated in display panel 40.

The heat that has generated in display panel 40 is conducted from front surface 40b of display panel 40 to thermal conductive sheet 42, and is diffused along the surface direction of thermal conductive sheet 42. The heat that has diffused along the surface direction of thermal conductive sheet 42 is conducted in the thickness direction of thermal conductive sheet 42, and is conducted from thermal conductive sheet 42 to light transmissive material 44. The heat that has conducted to light transmissive material 44 is diffused along the surface direction (in-plane XY direction) of light transmissive material 44, and is dissipated from approximately the entirety of light transmissive material 44 into the air. Note that part of the heat that has conducted to thermal conductive sheet 42 is conducted to light transmissive material 44 via adhesive 64, and is dissipated from light transmissive material 44 into the air.

As has been described above, since thermal conductive sheet 42 is sandwiched between light transmissive material 44 and front surface 40b of display panel 40 in this embodiment, heat generated in display panel 40 can be efficiently conducted outside display panel 40 via thermal conductive sheet 42 and light transmissive material 44, compared to the case where light transmissive material 44 is in direct contact with front surface 40b of display panel 40. As a result, heat generated in display panel 40 can be sufficiently dissipated, and thus damage to display panel 40 due to display panel 40 becoming very hot can be prevented.

[4. Variation]

Figure 6:
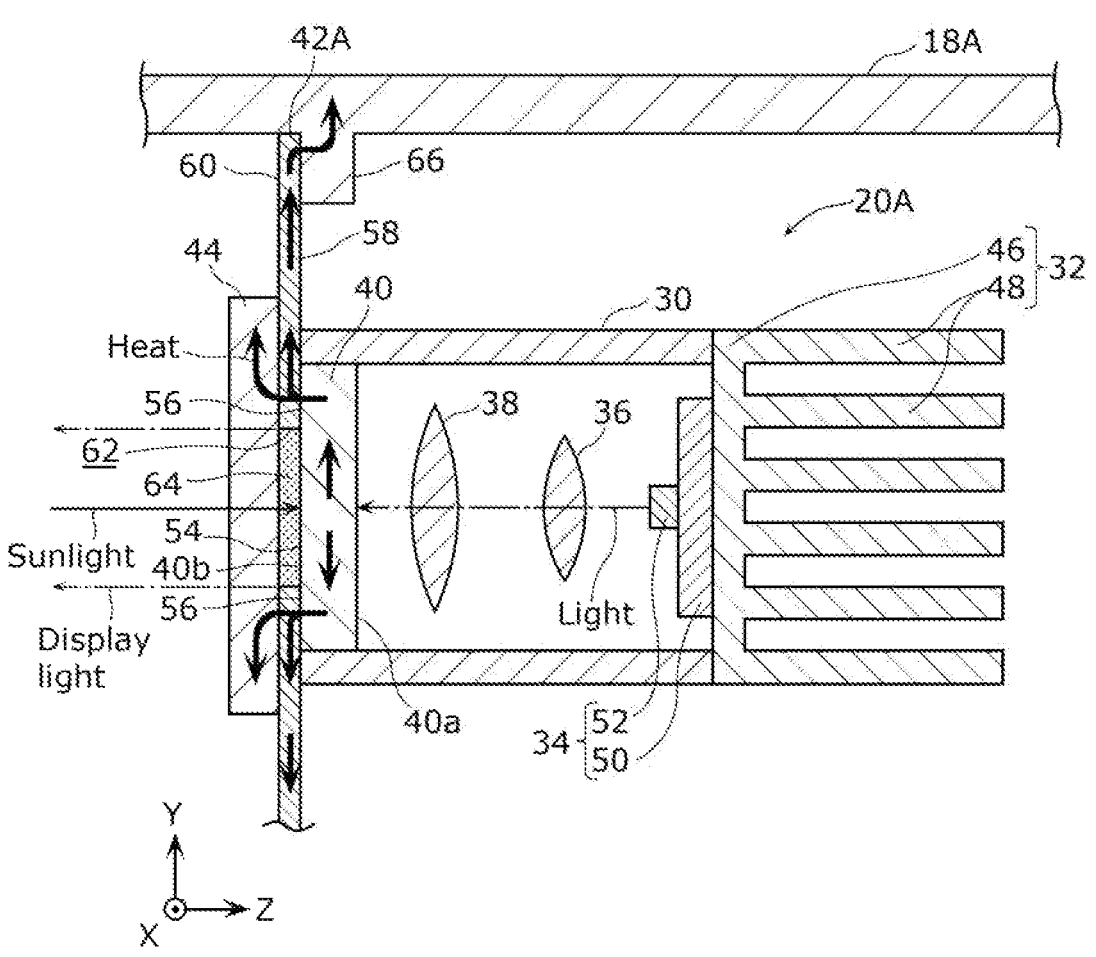
FIG. 6 is a cross sectional view of a display device according to a variation of the embodiment.

Next, a configuration of display device 20A according to a variation of the embodiment will be described with reference to FIG. 6. FIG. 6 is a cross sectional view of display device 20A according to the variation of the embodiment.

As illustrated in FIG. 6, in the variation, the periphery of thermal conductive sheet 42A of display device 20A is located outward of the periphery of light transmissive material 44 in the XY plan view. Moreover, attaching portion 66 that protrudes toward display device 20A is formed on the inner surface of main housing 18A, and the periphery of thermal conductive sheet 42A is in contact with this attaching portion 66 such that heat can be conducted.

With this, heat conducted to thermal conductive sheet 42A is conducted to light transmissive material 44 and as well to attaching portion 66, and thus the heat is dissipated not only from light transmissive material 44, but also from main housing 18A. As a result, heat of display panel 40 can be even more effectively dissipated.

Note that although the periphery of thermal conductive sheet 42A is in contact with main housing 18A such that heat can be conducted in this variation, the configuration is not limited to the foregoing configuration. The periphery of thermal conductive sheet 42A may be in contact with PGU housing 30 such that heat can be conducted. With this, heat conducted to thermal conductive sheet 42A is conducted to light transmissive material 44 and as well to PGU housing 30, and thus the heat is dissipated not only from light transmissive material 44, but also from PGU housing 30. As a result, the same advantageous effect as above can be produced.

Alternatively, the periphery of thermal conductive sheet 42A may be folded over to the back surface 40a side of display panel 40 such that the periphery of thermal conductive sheet 42A is in contact with the back surface 40a side of display panel 40 and heat can be conducted. With this, heat generated in display panel 40 can be efficiently conducted to light transmissive material 44 from each of the back surface 40a side and the front surface 40b side of display panel 40 via thermal conductive sheet 42A.

[Other Variations]

Hereinbefore, a display device according to one or more aspects has been described based on the above-described embodiments, but the present disclosure is not limited to these above-described embodiments. The scope of the one or more aspects of the present disclosure may encompass embodiments as a result of making, to the embodiments, various modifications that may be conceived by those skilled in the art and combining structural elements in different embodiments, as long as the resultant embodiments do not depart from the scope of the present disclosure.

For example, display light from display device 20 (20A) is caused to be reflected off area 12 of windshield 10 in the above-described embodiments, but the present disclosure is not limited to the above. Display light from display device 20 (20A) may be caused to be reflected off a combiner (one example of a display medium).

Moreover, thermal conductive sheet 42 is a graphite sheet in the above-described embodiments, but thermal conductive sheet 42 is not limited to the above. Thermal conductive sheet 42 may be metal foil such as copper or aluminum.

In addition, thermal conductive sheet 42 is disposed so as to contact front surface 40b of display panel 40 in the above-described embodiments, but the disposition of thermal conductive sheet 42 is not limited to the above. Thermal conductive sheet 42 may be disposed so as to contact back surface 40a of display panel 40. In this case, light transmissive material 44 is disposed such that thermal conductive sheet 42 is sandwiched between light transmissive material 44 and display panel 40 in the same manner as the above-described embodiments. Moreover, in this case, light from field lens 38 enters from back surface 40a of display panel 40 through opening 62 in thermal conductive sheet 42, and is projected from display area 54 as display light.

In addition, thermal conductive sheet 42 is sandwiched between light transmissive material 44 and display panel 40 in the above-described embodiments, but the present disclosure is not limited to the above. Light transmissive material 44 may be sandwiched between thermal conductive sheet 42 and display panel 40.

While various embodiments have been described herein above, it is to be appreciated that various changes in form and detail may be made without departing from the spirit and scope of the present disclosure as presently or hereafter claimed.

Further Information about Technical Background to this Application

The disclosure of the following patent application including specification, drawings, and claims is incorporated herein by reference in their entirety: Japanese Patent Application No. 2022-039254 filed on Mar. 14, 2022.

INDUSTRIAL APPLICABILITY

A display device according to the present disclosure is applicable to a PGU and the like provided in a head-up display for a vehicle, for example.

The invention claimed is:

1. A display device used for a head-up display, the display device comprising:
   a display panel that includes, in a front surface, a display area in which an image is displayed, and projects, from the display area, light that has entered from a back surface as display light showing the image;
   a thermal conductive sheet that is disposed directly contacting the display panel, and has an opening positionally corresponding with the display area;
   a light transmissive material that sandwiches the thermal conductive sheet together with the display panel; and
   a housing for accommodating the display panel, wherein
   a perimeter of the thermal conductive sheet is greater than a perimeter of the display panel, and
   in a view perpendicular to the display area of the display panel, a periphery of the thermal conductive sheet is located outward of a periphery of the light transmissive material, and contacts the housing.

2. The display device according to claim 1, wherein the thermal conductive sheet and the light transmissive material adhere to each other with an adhesive.

3. The display device according to claim 1, wherein the thermal conductive sheet is disposed contacting the front surface of the display panel, and
   the display light is projected from the display area of the display panel through the opening in the thermal conductive sheet.

4. The display device according to claim 1, wherein the thermal conductive sheet is disposed contacting the back surface of the display panel, and
   the light that has entered from the back surface of the display panel through the opening in the thermal conductive sheet is projected from the display area as the display light.

5. The display device according to claim 1, wherein in a view perpendicular to the display area of the display panel, the opening and the display area have a similar shape.

6. The display device according to claim 1, wherein a thickness of the light transmissive material is greater than a thickness of the thermal conductive sheet.

7. The display device according to claim 1, wherein the thermal conductive sheet is one of a graphite sheet and metal foil.

8. A head-up display comprising:
   the display device according to claim 1; and
   a mirror that reflects display light projected from the display device toward a display medium.

9. The display device according to claim 1, wherein the light transmissive material is a glass plate, and
   the light transmissive material is disposed opposite the display panel with the thermal conductive sheet interposed therebetween, and is in contact with the thermal conductive sheet.

10. The display device according to claim 1, wherein a perimeter of the light transmissive material is greater than the perimeter of the display panel.

11. A display device used for a head-up display, the display device comprising:
   a display panel that includes, in a front surface, a display area in which an image is displayed, and projects, from the display area, light that has entered from a back surface as display light showing the image;
   a thermal conductive sheet that is disposed directly contacting the display panel, and has an opening positionally corresponding with the display area; and
   a light transmissive material that sandwiches the thermal conductive sheet together with the display panel, wherein
   a perimeter of the thermal conductive sheet is greater than a perimeter of the display panel, and
   an inside of the opening in the thermal conductive sheet between the light transmissive material and the front surface of the display panel is filled with a transparent resin.

12. A display device used for a head-up display, the display device comprising:
   a display panel that includes, in a front surface, a display area in which an image is displayed, and projects, from the display area, light that has entered from a back surface as display light showing the image;
   a thermal conductive sheet that is disposed directly contacting the display panel, and has an opening positionally corresponding with the display area; and
   a light transmissive material that sandwiches the thermal conductive sheet together with the display panel, wherein
   a perimeter of the thermal conductive she than a perimeter of the display panel, and
   in a view perpendicular to a thickness direction of the display panel, a length of the light transmissive material is the same as a length of the thermal conductive sheet.

* * * * *